US012753527B2

(12) United States Patent
Lisfi

(10) Patent No.: US 12,753,527 B2
(45) Date of Patent: Oct. 6, 2026

(54) HIERARCHICAL INVERTED/NORMAL COBALT FERRITE NANO-CHESSBOARD

(71) Applicant: Morgan State University, Baltimore, MD (US)

(72) Inventor: Abdellah Lisfi, Baltimore, MD (US)

(73) Assignee: MORGAN STATE UNIVERSITY, Baltimore, MD (US)

( * ) Notice: Subject to any disclaimer, the term of this patent is extended or adjusted under 35 U.S.C. 154(b) by 447 days.

(21) Appl. No.: 18/405,155

(22) Filed: Jan. 5, 2024

(65) Prior Publication Data

US 2024/0240356 A1 Jul. 18, 2024

Related U.S. Application Data

(60) Provisional application No. 63/437,335, filed on Jan. 5, 2023.

(51) Int. Cl.
*C30B 29/26* (2006.01)
*C30B 23/00* (2006.01)
*C30B 23/06* (2006.01)
*C30B 35/00* (2006.01)

(52) U.S. Cl.
CPC ............ *C30B 29/26* (2013.01); *C30B 23/002* (2013.01); *C30B 23/063* (2013.01); *C30B 35/00* (2013.01)

(58) Field of Classification Search
CPC ..... C30B 23/002; C30B 23/04; C30B 23/063; C30B 23/066; C30B 29/26; C30B 35/00
See application file for complete search history.

(56) References Cited

U.S. PATENT DOCUMENTS

2011/0008008 A1* 1/2011 Chowdhury ............ H01Q 3/44 385/122
2022/0139423 A1* 5/2022 Kataguchi ............ G11B 5/842 428/323

FOREIGN PATENT DOCUMENTS

CN 104692828 A * 6/2015 ............ C04B 41/52
JP 2014059943 A * 4/2014 ............ G11B 5/65

OTHER PUBLICATIONS

English computer translation of CN-104692828-A (Year: 2026).*
English computer translation of JP-2014059943-A (Year: 2026).*

* cited by examiner

*Primary Examiner* — Matthew J Song
(74) *Attorney, Agent, or Firm* — Whiteford, Taylor & Preston, LLP; Peter J. Davis

(57) ABSTRACT

A cobalt ferrite film consisting of twinned cobalt ferrite isomer crystals, metastable normal $Co^{2+}_{tet}[Fe^{3+}_{oct}]_2O_4$ isomer [nCFO] and tetragonal inverted $Fe^{3+}_{tet}[Co^{2+}Fe^{3+}]_{oct}O^4$ isomer [iCFO], the nCFO and iCFO isomer crystals alternating in chessboard fashion in three dimensions, the cobalt ferrite film made by pulsed laser deposition in a vacuum chamber from a polycrystalline $CoFe_2O_4$ target on a single crystal one-side polished MgO substrate preferably heated to a temperature of greater than about 600° C.

6 Claims, 5 Drawing Sheets

HIERARCHICAL INVERTED/NORMAL COBALT FERRITE NANO-CHESSBOARD

GOVERNMENT RIGHTS

This invention was made with government support under Contract numbers NSF DMR 2055432 and NSF DMR 2117180, awarded by the National Science Foundation; and Contract number W911NF2110040, awarded by the Army Research Office. The government has certain rights in the invention.

FIELD OF THE INVENTION

This invention relates to cobalt ferrite films with specific magnetic properties.

BACKGROUND OF THE INVENTION

Among prior art, U.S. Pat. No. 8,865,109 elaborates on the need to stabilize nanostructure catalysts such as Fe and Co to enable carbon nanotube growth through chemical vapor deposition. U.S. Pat. No. 10,168,392 relates to a class of soft magnetic materials wherein a substrate is pre-stressed prior or deposition or applied after deposition to induce (tune) anisotropy.

SUMMARY OF THE INVENTION

The present invention is a chessboard structure created by a deposition process that involves some degree of epitaxial stress. Accordingly, there is provided according to an embodiment of the invention a cobalt ferrite film comprising twinned cobalt ferrite isomer crystals wherein the twinned cobalt ferrite isomers are metastable normal $Co^{2+}_{tet}[Fe^{3+}_{oct}]_2O_4$ isomer [nCFO] and tetragonal inverted $Fe^{3+}_{tet}[Co^{2+}Fe^{3+}]_{oct}O^4$ isomer [iCFO], wherein the cobalt ferrite film comprises a plurality of layers, and the nCFO and iCFO isomer crystals alternate in chessboard fashion in three dimensions. According to various preferred embodiments, the substrate may be MgO. The cobalt ferrite film may have a thickness of about 20 nm to about 500 nm. In any event, the cobalt ferrite films preferably have magnetic characteristics that are independent of its thickness. According to further embodiments, the cobalt ferrite films of the invention may have an anisotropy including first and second components, each having two-fold symmetry, each having different magnitudes, where the first component is aligned perpendicular to a surface of the film, and the second component is aligned parallel to a surface of the film.

According to further embodiments of the invention, there is provided a method of manufacturing a cobalt ferrite film comprising pulsed laser deposition in a vacuum chamber from a polycrystalline $CoFe_2O_4$ target on a single crystal one-side polished MgO substrate heated to a temperature of greater than about 600° C., preferably greater than about 700° C., and more preferably about 800° C. or greater. According to various further embodiments, the method may include evacuating the vacuum chamber prior to each deposition step and subsequently backfilling the vacuum chamber with $O_2$ gas and maintaining the $O_2$ pressure during the deposition step. According to preferred embodiments, the vacuum chamber is evacuated prior to each deposition step to about $10^{-4}$ mTorr or less, and preferably to about $10^{-6}$ Torr or less, and the chamber is backfilled with $O_2$ to about 30 mTorr or greater, and preferably to about 50 mTorr or greater and maintained during the deposition step. According to still further embodiments, the substrate-target distance may be maintained constant at about 55 mm. According to most preferred embodiments, the method comprises firing KrF laser pulses at a repetition rate of about 1 Hz to about 5 Hz, and preferably about 3 Hz, and irradiating the $CoFe_2O_4$ target with a constant energy density of 1 J/cm$^2$ to about 2 J/cm$^2$, preferably about 1.5 J/cm$^2$.

DETAILED DESCRIPTION OF THE INVENTION

Figure 1:
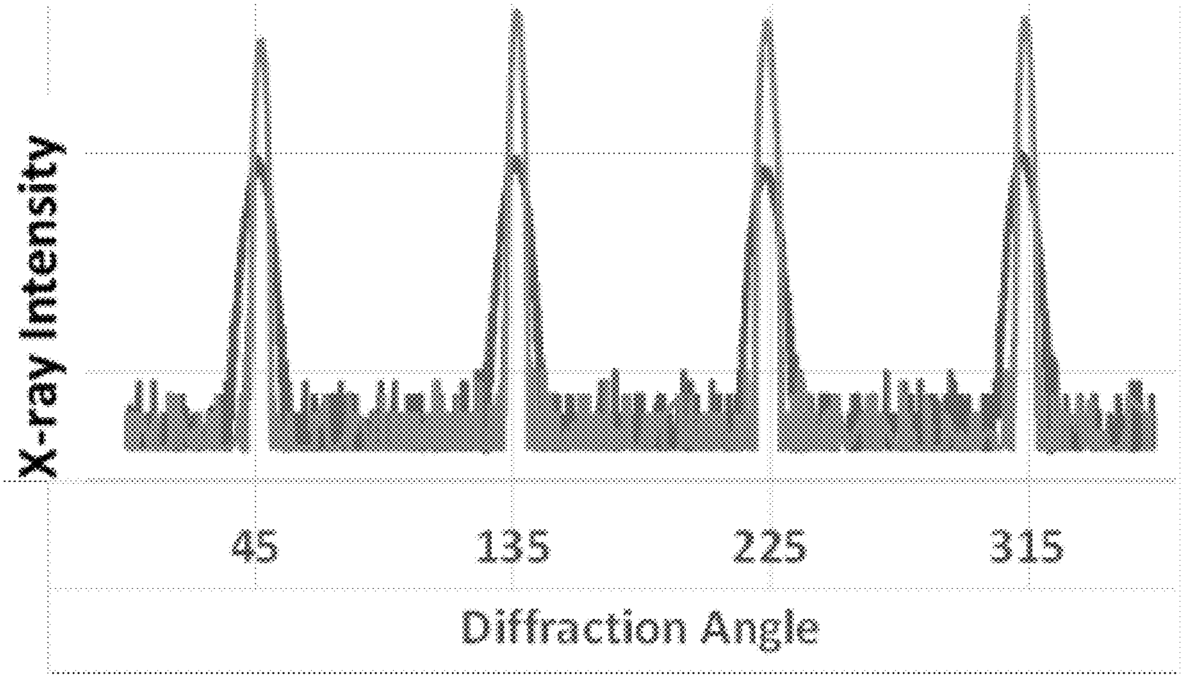
FIG. 1 is a Φ-scan of an iCFO/nCFO chessboard film according to an embodiment of the invention.

A nano-sized hierarchical chessboard was created consisting of two isomers of cobalt ferrite, metastable normal $Co^{2+}_{tet}[Fe^{3+}_{oct}]_2O_4$ [nCFO] and tetragonal inverted $Fe^{3+}_{tet}[Co^{2+}Fe^{3+}]_{oct}O^4$ [iCFO], which adapts to the cubic MgO substrate by twinning. This structure forms when $CoFe_2O_4$ (CFO) is epitaxially deposited on MgO at 800° C., driven by an average misfit of 1.7%. The magnetic characterization of the chessboard reveals hitherto unknown properties of nCFO. Its saturation magnetization is more than twice that of iCFO, 0.93 MAm$^{-1}$ as theoretically expected. In addition, using torque magnetometry, we find that the anisotropy density of nCFO equals $-1.16 \cdot 10^4$ Jm$^{-3}$, about one fifth of that of pure iron. Strain stabilized nCFO thus represents an attractive magnetic oxide material; it possesses a very high saturation magnetization and is extremely soft. Effectively, the chessboard structure forms due to the interface epitaxy between the CFO chessboard and substrate components of the heterostructure and substrate.

CFO films were prepared by pulsed laser deposition from a polycrystalline $CoFe_2O_4$ target on a single crystal one-side polished MgO substrate. The choice of MgO was motivated by its cubic structure with a very small lattice mismatch to $CoFe_2O_4$, 0.47%. Prior to each deposition, the vacuum chamber was evacuated to $<10^{-6}$ Torr and subsequently backfilled to 50 mTorr with high purity $O_2$, which was kept constant while growing the films. During the deposition process, the substrate was heated to 800° C. The substrate-target distance was maintained constant at 55 mm. Films with different thicknesses were synthesized by firing the KrF laser pulses at a repetition rate of 3 Hz and irradiating the $CoFe_2O_4$ target with a constant energy density of 1.5 J/cm$^2$. Under these conditions the CFO film self-organized into the iCFO/nCFO chessboard. In contrast, to produce CFO films with regular epitaxy, all the growth parameters were maintained identical to the ones reported above, except the substrate temperature, which was decreased to 300° C. The holding times at 800° C. and 300° C. did not allow interdiffusion of the CFO film and MgO substrate. Four sets of samples were prepared, 60 nm, 240 nm and 400 nm thick samples for magnetic measurements and 200 nm thick samples for structural investigations with XRD and TEM.

By analyzing the crystal structure and magnetic properties of the film we find that it is composed of the two isomers of cobalt ferrite, CFO, inverted CFO, iCFO, $$Fe^{3+}_{tet}[Co^{2+}Fe^{3+}]_{oct}O_4$$

and normal CFO, nCFO, $$Co^{2+}_{tet}[Fe^{3+}_{oct}]_2O_4,$$

which differ in the site occupancy of the cations as indicated by their formulas. The analyses lead to the discovery of hitherto unknown properties of metastable nCFO. They manifested themselves in the past indirectly during certain processing routes of CFO but had never been directly determined experimentally. The magnetization of nCFO, 930 emu/cm$^3$ is more than half of that of iron, and demonstrating that, contrary to iCFO, nCFO is magnetically ultra-soft. Its anisotropy energy equals −11.6 kJ/m$^3$, about one fifth of that of pure iron.

A four-circle PANAlytical diffractometer was applied to determine epitaxy of the (iCFO/nCFO)//MgO heterostructure and the in- and out-of-plane lattice parameters of the nano-chessboard components. See FIG. 1. The resulting diffraction pattern (Table 1) exhibits a four-fold symmetry perfectly aligned with respect to the substrate peaks, which represents confirmation of the epitaxial relationship between the nano-chessboard and the MgO substrate.

TABLE 1

Lattice parameters a ⊥ and a || of the chessboard structure

| XRD Experiment | λ [Å] | $2\theta_{max}$[°] | Formula | a[Å] |
|---|---|---|---|---|
| symm. (004) | 1.5405<br>1.5443 | 43.25<br>43.37 | $a_\perp = \frac{4\lambda}{2\sin(\theta_{max})}$ | $c_\perp^{iCFO} = 8.360$<br>$a_\perp^{nCFO} = 8.360$ |
| asymm. (511) | 1.5406 | 57.00<br>57.18 | $a_\parallel = \sqrt{\frac{2}{\frac{4\sin^2(\theta_{max})}{\lambda^2} - \frac{25}{a_\perp^2}}}$ | $a_\parallel^{iCFO} \approx 8.76$<br>$a_\parallel^{nCFO} = 8.360$ |

Figure 2:
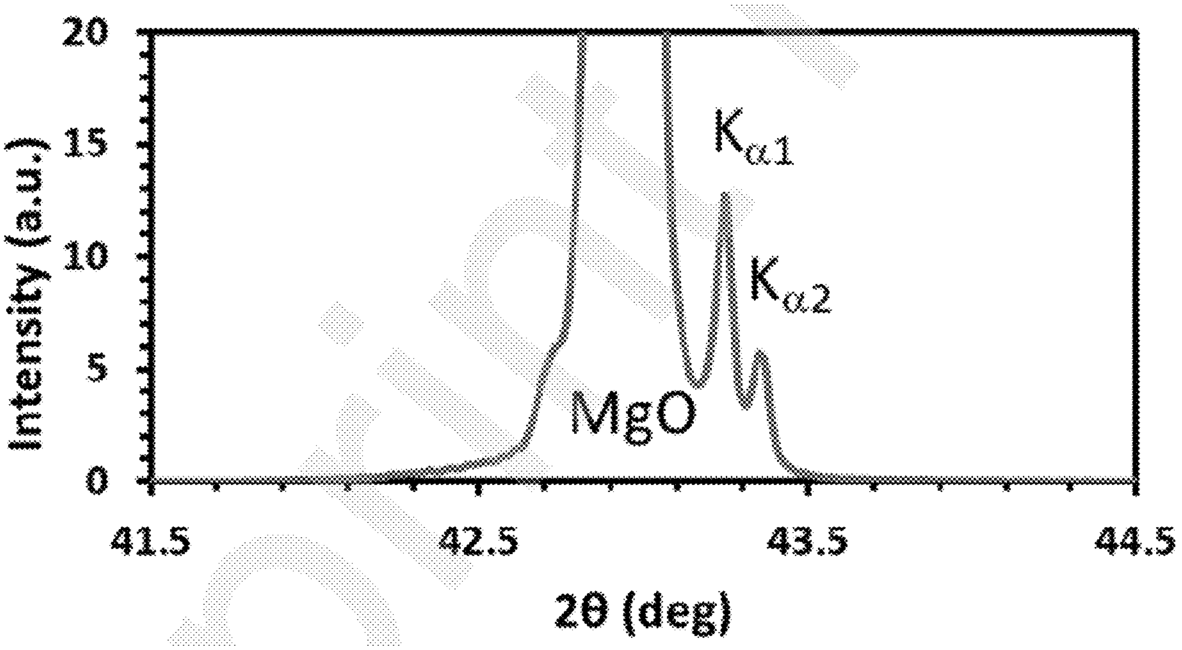
FIG. 2 is a symmetric XRD diffraction of the chessboard structure according to an embodiment of the invention.

Symmetric diffracting peaks of the nano-chessboard structure indicate a single out-of-plane lattice parameter, as both diffraction maxima yield the same lattice parameter. Its value agrees with the literature value of iCFO. Peaks are viewed via Cu-Kα radiation, FIG. 2. The resolution and almost theoretical intensity ratio of the diffraction maxima are attributable to the nano-chessboard structure, labeled Kα1 and Kα2.

Figure 3:
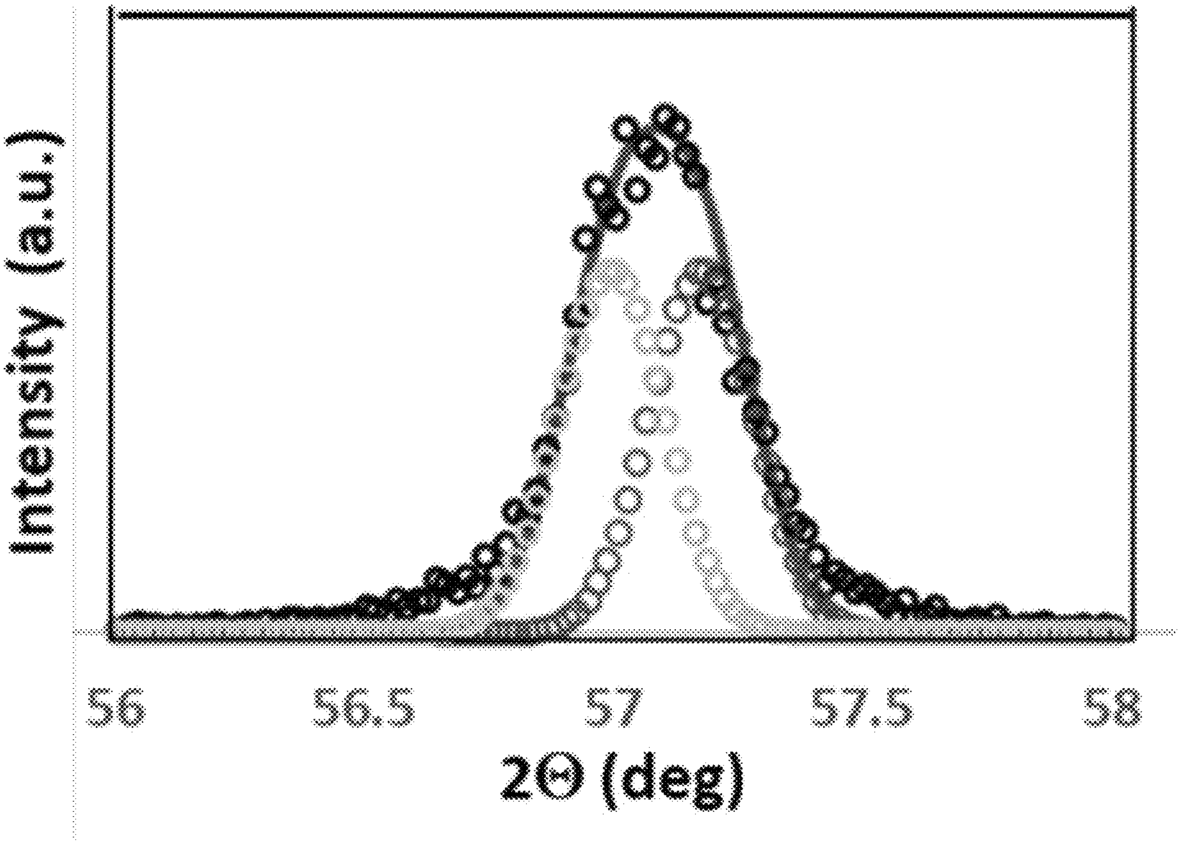
FIG. 3 is an oblique diffraction peak of a chessboard film according to an embodiment of the invention taken with CuKα X-rays.

With respect to asymmetric peaks, an approximate Gaussian fit to the asymmetric line profile yields two lattice parameters, indicating a cubic and a tetragonal phase, FIG. 3. The tetragonality is out-of-plane. The magnetic investigation identified the two phases as tetragonal iCFO and cubic nCFO.

Figure 4:
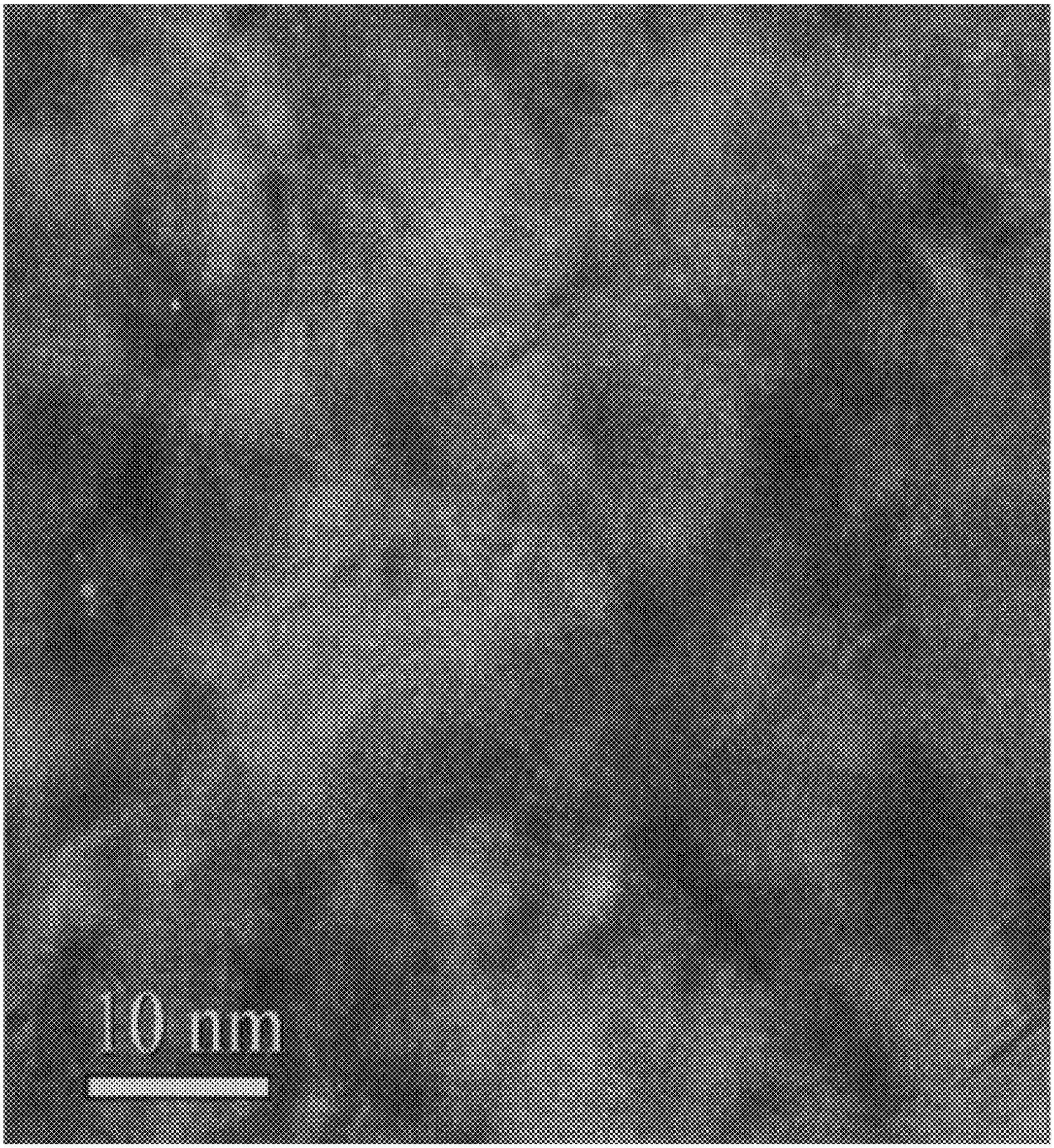
FIG. 4 is a high-resolution TEM image of a chessboard film according to an embodiment of the invention.

Transmission electron microscopy was performed using a JEOL 2100 FEG field emission TEM operated at 200 kV with spherical aberration coefficient Cs of 0.5 mm, point-point resolution of 0.19 nm and lattice resolution of 0.14 nm. The TEM samples were prepared by dissolving the MgO substrate from the sample in a solution with 4 wt. % ammonium sulphate at 70° C. The films were collected from the solution onto TEM copper grids with a 200 mesh. Selected area diffraction patterns, bright and dark field images and high-resolution lattice images were obtained from several areas of the samples to ascertain that representative structures and morphologies were acquired from each sample. A high-resolution TEM image of the heterostructure (FIG. 4) reveals that the structure consists of a chessboard-like arrangement.

Figure 5:
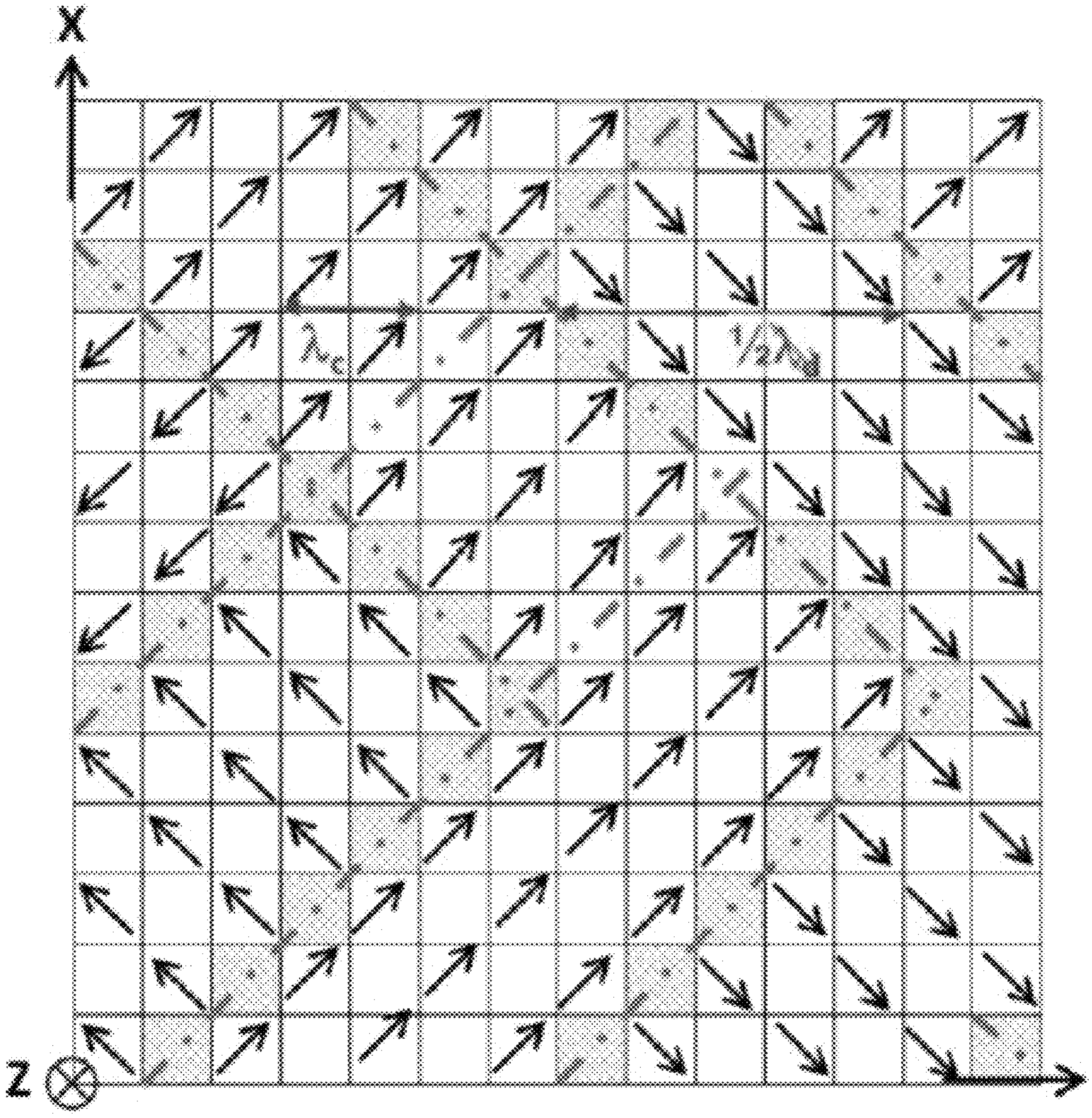
FIG. 5 is a schematic cartoon depicting the iCFO/nCFO/MgO chessboard heterostructure according to an embodiment of the invention, in the demagnetized state.

The "superstructure" diffraction spots of the image's diffraction pattern reflect its periodicity. The symmetry of the satellites of the (0,12,0) diffraction spot signals a secondary periodicity resulting from twinning driven by the magnetostriction of nCFO. See, e.g., FIG. 5.

Magnetic characterization was performed on regular epitaxial CFO/MgO and chessboard iCFO/nCFO//MgO heterostructures to show and highlight that these two structures display different properties and illustrate the uniqueness of the magnetic character of the chessboard. A MicroSense EZ9 VSM instrument was used for measurements on heterostructures having different thicknesses. The characters of their M-H curves differ in two ways. One, the M-H characteristics of regular epitaxial MgO heterostructures depend on the film thickness, whereas those of the chessboard/MgO heterostructures do not. More importantly, the saturation magnetization of the chessboard/MgO heterostructures is significantly larger than that of the regular epitaxial CFO/MgO heterostructures, which approximately equals the literature value, 400 emu/cm$^3$ (400 kA/m).

The character of the M-H curves of regular epitaxial CFO/MgO heterostructures stems from the controlling influence of the magnetoelastic anisotropy energy density of CFO $$K_{mel}^{CFO} = C\lambda\varepsilon$$

Where C is the elastic constant, λ is the magnetostriction constant, and ε is the film strain. In a thin film, the magnetoelastic anisotroy field $$H_{K,mel} = 2K_{mel}^{CFO}/M_s^{CFO}$$

is larger than the demagnetizing field $$H_d = NM_s^{CFO},$$

where N is the demagnetization factor, and stabilizes the magnetization out-of-plane, which provides an estimate of $$H_{K,mel} \approx 50kOe,$$

However, in the thick film, $$|H_{K,mel}$$

no longer controls the spin reorientation. The magnetization easy axis switches to be in-plane, favored by the shape anisotropy since in the cubic structure the out-of-plane ([100]) and the in-plane ([010] and [001]) axes are magnetically equivalent. Thus, the thickness dependence of the anisotropy alignment in regular epitaxial CFO films is mainly caused by the dominant magneto elastic anisotropy of the thin CFO film. The thickness-independent M-H characteristics of the chessboard films signal a different anisotropy energy. The increased saturation magnetization of the nano-chessboard structure, $$\mu_s^{chbd}$$

(per lattice unit), reflects the large magnetization of nCFO, $$\mu_s^{nCFO} = 2\mu_B^{FE} - \mu_B^{Co},$$

while in iCFO the magnetic moment $$\mu_s^{iCFO} = \mu_B^{Co}.$$

Thus, the average moment of the chessboard structure, $$\mu_s^{chbd} = 1/2(\mu_s^{iCFO} + \mu_s^{nCFO}) = 1/2(2\mu_B^{FE} - \mu_B^{Co} + \mu_B^{Co}),$$

and the ratio $$\mu_s^{chbd}/\mu_s^{iCFO} = 1/2(2\mu_B^{FE} - \mu_B^{Co} + \mu_B^{Co})/\mu_B^{Co} = \mu_B^{FE}/\mu_B^{Co} \approx 1.67.$$

The experimental data show $$\mu_s^{chbd}/\mu_s^{iCFO} \approx 1.58,$$

on good agreement with this prediction. In addition to its large magnetization intensity, 570 emu/cm$^3$, the chessboard manifests a uniform magnetic character with reduced hysteresis and an anisotropy confined to the normal to the film plane regardless of film thickness.

Further investigation of the magnetic anisotropy was conducted through torque measurements by using an instrument which also contains a brief introduction into their analysis. The torque, $$L(\theta) = -\frac{dK(\theta)}{d\theta},$$

through the anisotropy energy density, K(θ), carries information on the symmetry of the magnetization, M(θ), and the alignment of the anisotropy and the magnitude of its different components. Experimentally it is determined by the product L=M×H, which equals:

$$\begin{pmatrix} L_x(\theta_x) \\ L_y(\theta_y) \\ L_z(\theta_z) \end{pmatrix} = \begin{pmatrix} M_yH_z - M_zH_y \\ M_zH_x - M_xH_z \\ M_xH_y - M_yH_x \end{pmatrix}.$$

Thus, the torque Ly(θy), measured by rotating the sample around the y-axis in a field H=Hx yields Mz(θy). Conversely, the torque Lz(θz), determined using H=Hx, yields the angular dependence of the magnetization in the x,y plane. The phase of L yields information on its direction with respect to a reference angle, e.g., the film normal. Out-of-plane torque curves of films of regular epitaxy reveal: 1) a two-fold symmetry of the torque curves, which is an indication of the uniaxial character of the anisotropy in both thin and thick films; 2) the shift of the rotational hysteresis angle from 90° to 0°, which illustrates the spin reorientation reported above; and 3) the reduction of rotational hysteresis upon increasing the film thickness confirming an anisotropy weakening prior to the spin reorientation The magnetic characteristics of the chessboard heterostructure are thickness-independent. Hence, their anisotropy measurement was restricted to the thick film. We find that the anisotropy of the chessboard consists of two components, each of two-fold symmetry but different magnitudes. The angular position of the rotational hysteresis indicates that the large component is aligned parallel to the film normal, whereas the small one lies in the film plane. Reducing the magnitude of the measuring field from 2 T to 1 T enhances the rotational hysteresis of the large anisotropy component, whereas the small component becomes nearly reversible. This reflects the large difference of their anisotropy fields, Hk, which is much larger and much smaller than the measurement field (1T) for the out-of-plane and the in-plane anisotropy components, respectively. To fully understand the origin of these two anisotropy components, we performed in-plane torque measurements for both thick films, the one displaying regular epitaxy, and the one with the chessboard structure. Both torque curves exhibit four-fold cubic symmetry corroborating the previous result on the thick film with regular epitaxy. However, the sign and magnitude of the anisotropy are positive (+K sin(4ez)) and large for the regular epitaxy and negative (−K sin(4ez)) and small for the chessboard. It follows that the magnetization easy axis lies parallel to [010] and [011] for regular epitaxy and chessboard heterostructures, respectively. The different magnitudes point towards a different site occupancy of $Co^{2\text{-}F}$ as it is known that octahedral $Co^{2\text{-}F}$ yields a large positive anisotropy (iCFO) and tetrahedral $Co^{2\text{-}F}$ generates a small negative anisotropy (nCFO). Combining both out-of-plane and in-plane torque measurements, it becomes clear that the chessboard consists of two anisotropy components, which are oriented out-of-plane and in-plane.

By stabilizing a normally metastable compound by an epitaxial stress, it appears possible to integrate this magnetically attractive compound in electronic devices.

The invention claimed is:

1. A cobalt ferrite film comprising twinned cobalt ferrite isomer crystals wherein the twinned cobalt ferrite isomers are metastable normal $Co^{2+}{}_{tet}[Fe^{3+}{}_{oct}]_2O_4$ isomer [nCFO] and tetragonal inverted $Fe^{3+}{}_{tet}[Co^{2+}Fe^{3+}]_{oct}O^4$ isomer [iCFO], wherein said cobalt ferrite film comprises a plurality of layers, and said nCFO and iCFO isomer crystals alternate in chessboard fashion in three dimensions.

2. The cobalt ferrite film according to claim 1 comprising an MgO substrate.

3. The cobalt ferrite film according to claim 1 having a thickness of about 20 nm to about 500 nm.

4. The cobalt ferrite film according to claim 1 having magnetic characteristics that are independent of its thickness.

5. The cobalt ferrite film according to claim 1, having an anisotropy consists of first and second components, each having two-fold symmetry, each having different magnitudes, the first component aligned perpendicular to a surface of the film, and the second component aligned parallel to a surface of the film.

6. A method of manufacturing a cobalt ferrite film comprising pulsed laser deposition in a vacuum chamber from a polycrystalline $CoFe_2O_4$ target on a single crystal one-side polished MgO substrate heated to a temperature of greater than about 600° C.

* * * * *